(12) United States Patent
Zhou et al.

(10) Patent No.: US 11,791,704 B2
(45) Date of Patent: Oct. 17, 2023

(54) CONTROL METHOD OF SWITCHING CIRCUIT, CONTROL CIRCUIT OF SWITCHING CIRCUIT, AND SWITCHING CIRCUIT

(71) Applicant: Joulwatt Technology Co., Ltd., Hangzhou (CN)

(72) Inventors: Yin Zhou, Hangzhou (CN); Aimin Xu, Hangzhou (CN)

(73) Assignee: JOULWATT TECHNOLOGY CO., LTD., Hangzhou (CN)

( * ) Notice: Subject to any disclaimer, the term of this patent is extended or adjusted under 35 U.S.C. 154(b) by 191 days.

(21) Appl. No.: 17/567,010

(22) Filed: Dec. 31, 2021

(65) Prior Publication Data

US 2022/0231591 A1 Jul. 21, 2022

(30) Foreign Application Priority Data

Jan. 18, 2021 (CN) .......................... 202110061952.4

(51) Int. Cl.
*H02M 1/08* (2006.01)
*H02M 1/00* (2006.01)
*H03M 1/66* (2006.01)

(52) U.S. Cl.
CPC ........... *H02M 1/0029* (2021.05); *H02M 1/08* (2013.01); *H03M 1/66* (2013.01)

(58) Field of Classification Search
CPC .... H02M 1/0029; H02M 1/08; H02M 1/0012; H02M 1/0025; H03M 1/66
See application file for complete search history.

(56) References Cited

U.S. PATENT DOCUMENTS

| 9,705,521 B1 * | 7/2017 | Monk ................. H03M 1/0665 |
| 2012/0182049 A1 * | 7/2012 | Garbossa .............. H02M 3/155 |
| | | 327/109 |
| 2018/0152146 A1 * | 5/2018 | Tai ........................ H03F 3/3435 |
| 2021/0067026 A1 * | 3/2021 | Tsai ....................... H02M 1/08 |

* cited by examiner

*Primary Examiner* — Kyle J Moody
(74) *Attorney, Agent, or Firm* — Bayramoglu Law Offices LLC

(57) ABSTRACT

A control method of a switching circuit, a control circuit of the switching circuit and the switching circuit are provided. The control circuit includes a slope buffer and a first operational amplifier. The slope buffer receives a first voltage reference, and controls slopes of a rising edge and a falling edge to generate a second voltage reference. The first operational amplifier receives an output feedback voltage and a reference voltage, and performs an operational amplification to obtain a compensation voltage. When the first voltage reference has the falling edge, the reference voltage is coupled to the first voltage reference through a first switch, and the second voltage reference is coupled to an output voltage through a second switch. When the first voltage reference has the rising edge, the reference voltage is coupled to the second voltage reference through a third switch.

19 Claims, 5 Drawing Sheets

CONTROL METHOD OF SWITCHING CIRCUIT, CONTROL CIRCUIT OF SWITCHING CIRCUIT, AND SWITCHING CIRCUIT

CROSS REFERENCE TO THE RELATED APPLICATIONS

This application is based upon and claims priority to Chinese Patent Application No. 202110061952.4, filed on Jan. 18, 2021, the entire contents of which are incorporated herein by reference.

TECHNICAL FIELD

The present disclosure relates to the technical field of power electronics, and more particularly to a control method of a switching circuit, a control circuit of the switching circuit, and the switching circuit.

BACKGROUND

In the switched-mode power supply (SMPS), especially the power supply for the Intel® processor, the SMPS needs to receive instructions from the processor and adjust the output voltage in real time to optimize processor performance and power consumption. In order to achieve this function, after a specific instruction is received, the reference voltage needs to follow the output voltage. In the prior art, the output voltage is sampled, and the reference voltage that follows the output voltage is generated through an analog-to-digital conversion circuit and a digital-to-analog conversion circuit. Due to the fast rate of change of the output voltage, a fast analog-to-digital conversion circuit and a fast digital-to-analog conversion circuit are required. The present disclosure directly uses an analog circuit to realize that a voltage reference follows the output voltage, which is convenient and low in cost.

SUMMARY

In view of the above, a purpose of the present disclosure is to provide a control method of a switching circuit, a control circuit of the switching circuit, and the switching circuit to solve the problems that fast analog-to-digital conversion circuit and digital-to-analog conversion circuit are required to make a voltage reference follow the output voltage in the prior art.

A technical solution of the present disclosure is to provide a control method of a switching circuit. The control method includes the following steps: generating a first voltage reference, and controlling slopes of a rising edge and a falling edge to generate a second voltage reference; and performing an operational amplification on an output feedback voltage and a reference voltage to obtain a compensation voltage. When the first voltage reference has the falling edge, the reference voltage is coupled to the first voltage reference through a first switch, and the second voltage reference is coupled to an output voltage through a second switch. When the first voltage reference has the rising edge, the reference voltage is coupled to the second voltage reference through a third switch.

Optionally, the slopes of the rising edge and the falling edge of the first voltage reference may be controlled according to set slopes to generate the second voltage reference.

Optionally, a central processing unit (CPU) may set the slopes.

Another technical solution of the present disclosure is to provide a control circuit of a switching circuit. The control circuit includes a slope buffer and a first operational amplifier. The slope buffer receives a first voltage reference, and controls slopes of a rising edge and a falling edge to generate a second voltage reference. The first operational amplifier receives an output feedback voltage and a reference voltage, and performs an operational amplification to obtain a compensation voltage.

When the first voltage reference has the falling edge, the reference voltage is coupled to the first voltage reference through a first switch, and the second voltage reference is coupled to an output voltage through a second switch. When the first voltage reference has the rising edge, the reference voltage is coupled to the second voltage reference through a third switch.

Optionally, the slopes of the rising edge and the falling edge of the first voltage reference may be controlled according to set slopes to generate the second voltage reference.

Optionally, a central processing unit (CPU) may set the slopes.

Optionally, the control circuit may further include a digital-to-analog conversion circuit, and the digital-to-analog conversion circuit may generate the first voltage reference.

Optionally, when the first voltage reference has the falling edge, a first signal may change from being invalid to being valid. When the first voltage reference has the rising edge, the first signal may change from being valid to being invalid. When the first signal is valid, the reference voltage may be coupled to the first voltage reference through the first switch, and the second voltage reference may be coupled to the output voltage through the second switch. When the first signal is invalid, the reference voltage may be coupled to the second voltage reference through the third switch.

Optionally, when a first enable signal is valid, and when the first voltage reference has the falling edge, the first signal may change from being invalid to being valid. When the first voltage reference has the rising edge, the first signal may change from being valid to being invalid.

When the first enable signal is invalid, the first signal may be invalid.

Optionally, the first enable signal may be SetVID_Decay.

Optionally, the slope buffer may include a second operational amplifier and a first capacitor. A first terminal of the second operational amplifier may receive the first voltage reference, and a second terminal of the second operational amplifier may be coupled to an output terminal of the second operational amplifier, and may be coupled to a negative voltage output terminal of the switching circuit through the first capacitor.

Optionally, the first operational amplifier may include a first current-type operational amplifier, a first compensation capacitor, a proportion amplification circuit and a first voltage follower. The first current-type operational amplifier may receive the output feedback voltage and the reference voltage. The proportion amplification circuit may receive the output voltage and the reference voltage. The proportion amplification circuit may be coupled to a common-mode voltage. An output of the first current-type operational amplifier may be coupled to an output of the proportion amplification circuit through the first compensation capacitor. The output of the first current-type operational amplifier may generate the compensation voltage through the first voltage follower.

Another technical solution of the present disclosure is to provide an operational amplification circuit. The operational amplification circuit includes a first current-type operational amplifier, a first compensation capacitor and a proportion amplification circuit. The first current-type operational amplifier receives a first feedback voltage and a reference voltage. The proportion amplification circuit receives a first voltage and the reference voltage, and is coupled to a common-mode voltage, and performs a proportional amplification on the first voltage and the reference voltage. An output of the first current-type operational amplifier is coupled to an output of the proportion amplification circuit through the first compensation capacitor. The output of the first current-type operational amplifier generates a compensation voltage.

Optionally, the proportion amplification circuit may include a second current-type operational amplifier and a first resistor. The second current-type operational amplifier may receive the first voltage and the reference voltage. An output of the second current-type operational amplifier may be coupled to the common-mode voltage through the first resistor. The output of the second current-type operational amplifier may be an output of the proportion amplification circuit.

Optionally, the operational amplification circuit may further include a first voltage follower. The output of the first current-type operational amplifier may generate the compensation voltage through the first voltage follower.

Optionally, a gain of the second current-type operational amplifier may be k times that of the first current-type operational amplifier. k may be greater than 1.

Optionally, the first voltage may be an output voltage. The first feedback voltage may be an output feedback voltage. The output voltage may be coupled to the output feedback voltage through a second resistor. An output sampling current may be coupled to the output feedback voltage.

Optionally, the first voltage may be coupled to the first feedback voltage through a voltage-dividing circuit. The voltage-dividing circuit may divide the first voltage.

Optionally, the voltage-dividing circuit may include a first control switch, a second control switch, a voltage-dividing resistor and a second voltage follower. The first voltage may be coupled to an input terminal of the second voltage follower through the first control switch. The first voltage may be coupled to the second control switch through the voltage-dividing resistor. The second control switch may be coupled to the input terminal of the second voltage follower. An output terminal of the second voltage follower may be coupled to the first feedback voltage. The operational amplification circuit may receive the reference voltage and a voltage of the input terminal of the second voltage follower.

Another technical solution of the present disclosure is to provide a switching circuit.

Compared with the prior art, the structure and method of the circuit according to the present disclosure have advantages as follows: an analog circuit is used to realize that the voltage reference follows the output voltage, which is convenient and low in cost.

DETAILED DESCRIPTION OF THE EMBODIMENTS

The preferred embodiments of the present disclosure are described in detail below with reference to the drawings, but the present disclosure is not limited to these embodiments. The present disclosure covers any substitution, modification, equivalent method and solution made within the spirit and scope of the present disclosure.

For a better understanding of the present disclosure, the specific details of the following preferred embodiments of the present disclosure are explained herein after in detail, while the present disclosure can also be fully understood by those skilled in the art without the description of these details.

The present disclosure is described in detail by giving examples with reference to the drawings. It should be noted that the drawings are simplified and do not use an accurate proportion, that is, the drawings are merely for the objectives of conveniently and clearly assisting in illustrating embodiments of the present disclosure.

Figure 1:
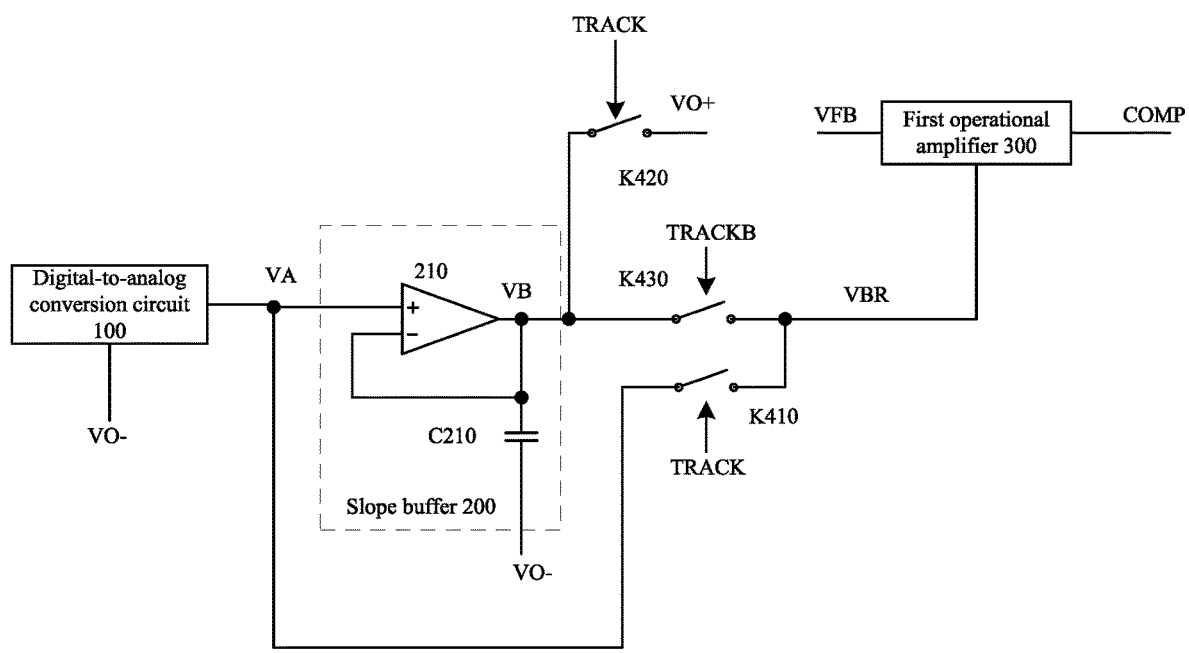
FIG. 1 is a schematic diagram of a control circuit according to the present disclosure.
Figure 2:
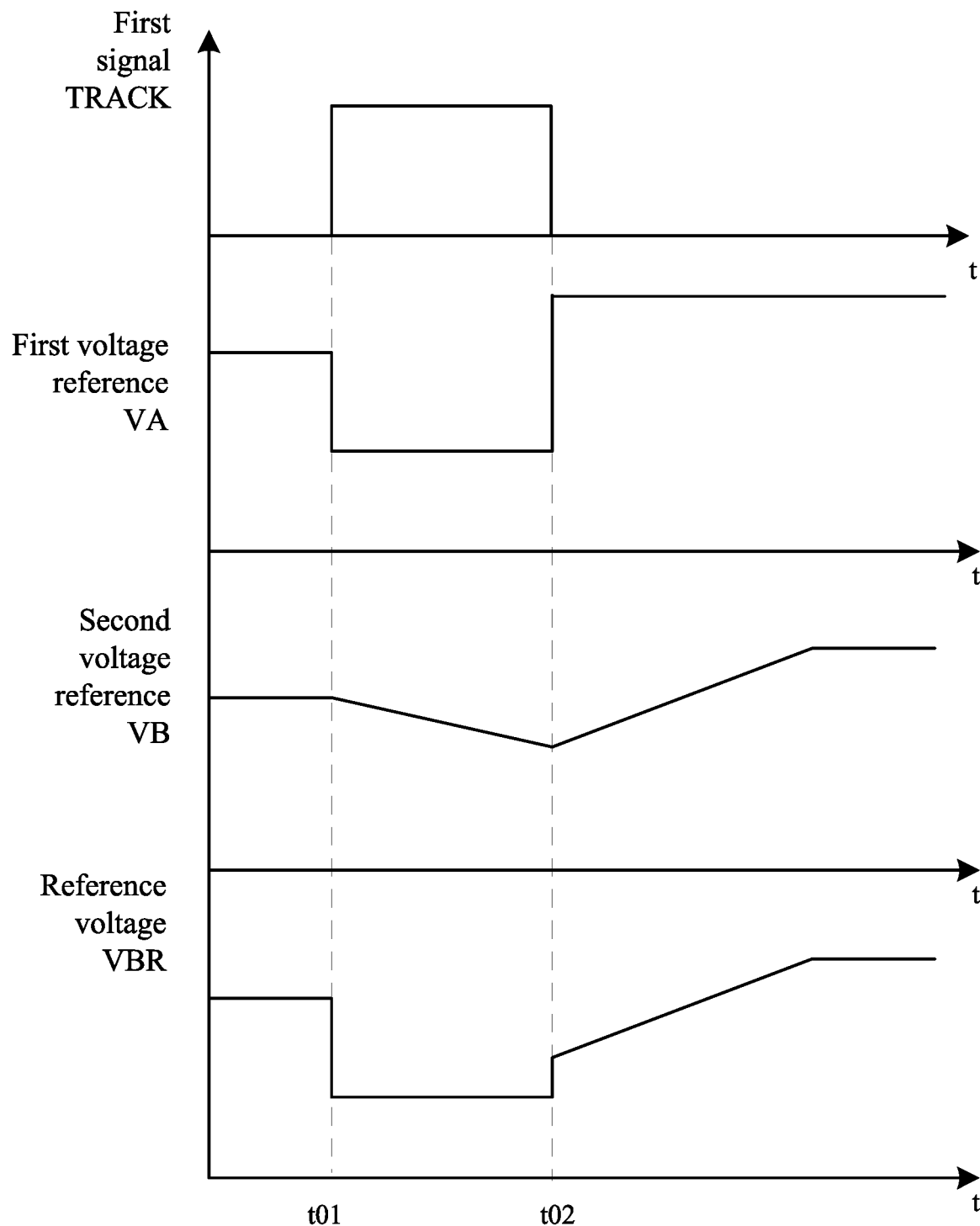
FIG. 2 is a schematic waveform diagram of a first signal, a first voltage reference, a second voltage reference and a reference voltage of the control circuit according to the present disclosure.

The present disclosure provides a control circuit of a switching circuit. As shown in FIG. 1, the control circuit includes a slope buffer 200 and a first operational amplifier 300. The slope buffer 200 receives a first voltage reference VA, and controls slopes of a rising edge and a falling edge to generate a second voltage reference VB. The first operational amplifier 300 receives an output feedback voltage VFB and a reference voltage VBR, and performs an operational amplification to obtain a compensation voltage COMP. When the first voltage reference VA has the falling edge, the reference voltage VBR is coupled to the first voltage reference VA through a first switch K410, and the second voltage reference VB is coupled to an output voltage VO+ through a second switch K420. When the first voltage reference VA has the rising edge, the reference voltage VBR is coupled to the second voltage reference VB through a third switch K430. FIG. 2 is a schematic waveform diagram of the first voltage reference VA, the second voltage reference VB and the reference voltage VBR of the control circuit according to the present disclosure. At moment t01, the first voltage reference VA has the falling edge. After passing through the slope buffer 200, the slope of the falling edge of the second voltage reference VB becomes lower. The reference voltage VBR at this time is approximately equal to the first voltage reference VA. At moment t02, the first voltage reference VA has the rising edge, and at this time, the second voltage reference VB starts to rise slowly before it drops to a voltage between moment t01 and moment t02 of the first voltage reference VA, and the reference voltage VBR steps to the value of the second voltage reference VB and starts to rise slowly like the second voltage reference VB. In the present disclosure, an analog circuit is used to realize that the voltage reference follows the output voltage, which is convenient and the cost is low.

In an embodiment, the slopes of the rising edge and the falling edge of the first voltage reference VA are controlled according to set slopes. The set slopes are not limited to linear slopes shown in FIG. 2, and may be any type of slopes. In an embodiment, a CPU is used to set the slopes.

As shown in FIG. 1, the control circuit further includes a digital-to-analog conversion circuit 100, and the digital-to-analog conversion circuit generates the first voltage reference VA.

Figure 3:
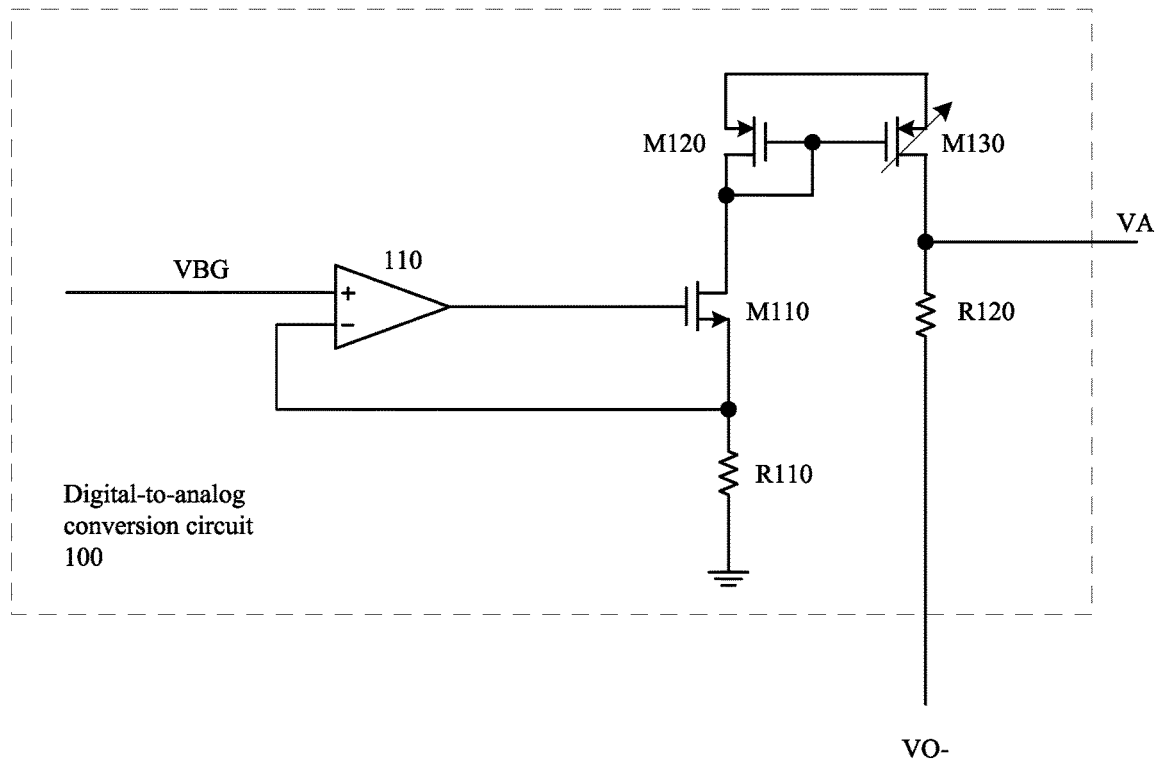
FIG. 3 is a schematic circuit diagram of an embodiment of a digital-to-analog conversion circuit 100 of the control circuit according to the present disclosure.

FIG. 3 shows an embodiment of the digital-to-analog conversion circuit 100. The digital-to-analog conversion circuit 100 includes an operational amplifier 110, a current mirror composed of switching tubes M120 and M130, a switching tube M110, a resistor R110, and a resistor R120. The operational amplifier 110 receives an internal voltage reference VBG and a voltage on the resistor R110. The output of the operational amplifier 110 is coupled to the gate of the switching tube M110. The source of the switching tube M110 is coupled to the resistor R110. The other terminal of the resistor R110 is coupled to the reference ground. The drain of the switching tube M110 is coupled to the input terminal of the current mirror. The digital signal controls the number of the actually coupled current mirrors. The output terminal of the current mirror is coupled to the resistor R120. A voltage on the resistor R120 is the output voltage of the digital-to-analog conversion circuit 100.

In an embodiment, a first signal is used to control the first switch K410, the second switch K420 and the third switch K430. When the first voltage reference VA has the falling edge, the first signal TRACK changes from being invalid to being valid. When the first voltage reference has the rising edge, the first signal TRACK changes from being valid to being invalid. When the first signal is valid, the reference voltage VBR is coupled to the first voltage reference VA through the first switch K410, and the second voltage reference VB is coupled to the output voltage VO+ through the second switch K420. When the first signal TRACK is invalid, the reference voltage is coupled to the second voltage reference VB through the third switch K430. TRACKB and TRACK shown in FIG. 1 are logically complementary. In an embodiment, being valid may correspond to a high level, and being invalid may correspond to a low level. In another embodiment, in contrast, being valid may correspond to a low level, and being invalid may correspond to a high level.

In an embodiment, when a first enable signal is valid, and when the first voltage reference has the falling edge, the first signal changes from being invalid to being valid, and when the first voltage reference has the rising edge, the first signal changes from being valid to being invalid. When the first enable signal is invalid, the first signal is invalid. The first enable signal is SetVID_Decay. SetVID_Decay is an instruction in the SVID protocol for communication between the Intel processor and its power supply, and is used to reduce the output voltage of the power supply to a new target value with a slope determined by the load, so as to save power consumption.

In an embodiment, as shown in FIG. 1, the slope buffer 200 includes a second operational amplifier 210 and a first capacitor C210. A first terminal of the second operational amplifier 210 receives the first voltage reference VA, and a second terminal of the second operational amplifier 210 is coupled to an output terminal VB of the second operational amplifier 210, and is coupled to a negative voltage output terminal VO− of the switching circuit through the first capacitor C210.

Figure 4:
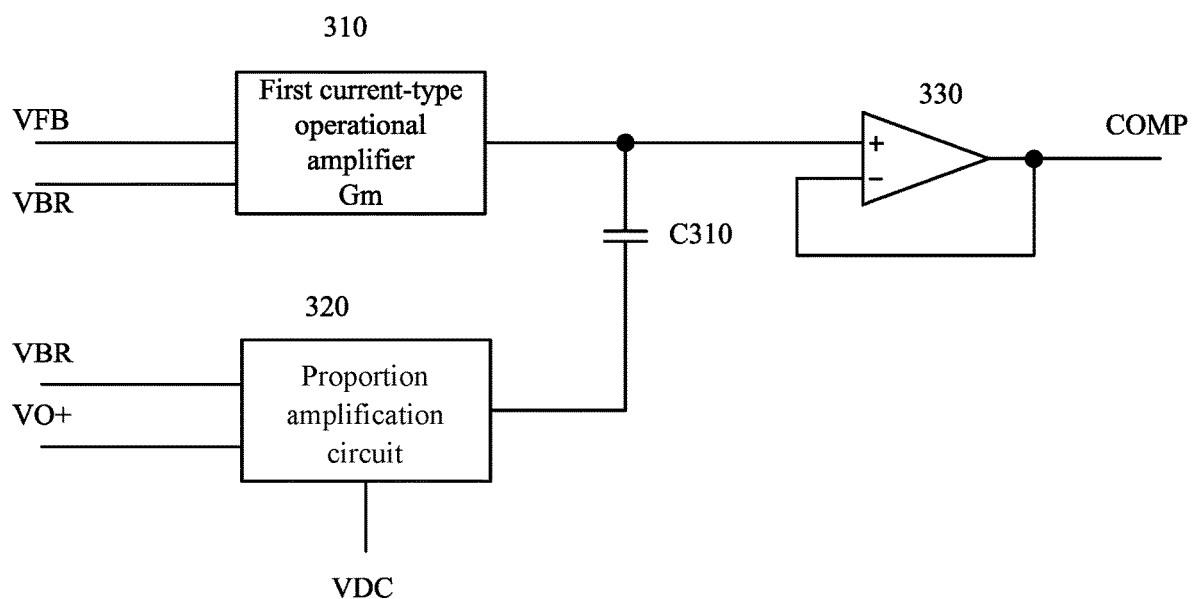
FIG. 4 is a schematic circuit diagram of an embodiment of an operational amplifier 300 according to the present disclosure.

As shown in FIG. 4, the first operational amplifier 300 includes a first current-type operational amplifier 310, a first compensation capacitor C310, a proportion amplification circuit 320 and a first voltage follower 330. The first current-type operational amplifier 310 receives the output feedback voltage VFB and the reference voltage VBR. The proportion amplification circuit 320 receives the output voltage VO+ and the reference voltage VBR. The proportion amplification circuit 320 is coupled to a common-mode voltage VDC. An output of the first current-type operational amplifier 310 is coupled to an output of the proportion amplification circuit 320 through the first compensation capacitor C310. The output of the first current-type operational amplifier 310 generates the compensation voltage COMP through the first voltage follower 330.

A technical solution of the present disclosure is to provide a control method of a switching circuit. The control method includes the following steps: generating a first voltage reference, and controlling slopes of a rising edge and a falling edge to generate a second voltage reference; and performing an operational amplification on an output feedback voltage and a reference voltage to obtain a compensation voltage; when the first voltage reference has the falling edge, the reference voltage is coupled to the first voltage reference through a first switch, and the second voltage reference is coupled to an output voltage through a second switch; when the first voltage reference has the rising edge, the reference voltage is coupled to the second voltage reference through a third switch.

As an optional solution, the slopes of the rising edge and the falling edge of the first voltage reference are controlled according to set slopes.

As an optional solution, a central processing unit (CPU) may set the slopes.

A yet another technical solution of the present disclosure is to provide an operational amplification circuit. As shown in FIG. 4, the operational amplification circuit includes a first current-type operational amplifier 310, a first compensation capacitor C310 and a proportion amplification circuit 320. The first current-type operational amplifier 310 receives a first feedback voltage VFB and a reference voltage VBR. The proportion amplification circuit 320 receives a first voltage and the reference voltage VBR, and is coupled to a common-mode voltage VDC, and performs a proportional amplification on the first voltage and the reference voltage VBR. An output of the first current-type operational amplifier 310 is coupled to an output of the proportion amplification circuit 320 through the first compensation capacitor C310. A compensation voltage COMP is generated by the output of the first current-type operational amplifier 310. In an embodiment, the operational amplification circuit further includes a first voltage follower 330. The output of the first current-type operational amplifier 310 generates a compensation voltage through the first voltage follower 330. In FIG. 4, the output of the first current-type operational amplifier 310 generates the compensation voltage COMP through the voltage follower 330, and the voltage follower 330 is used to prevent the circuit coupled post the compensation voltage COMP from affecting the operational amplification circuit. Therefore, the voltage follower 330 may be optional.

Figure 5:
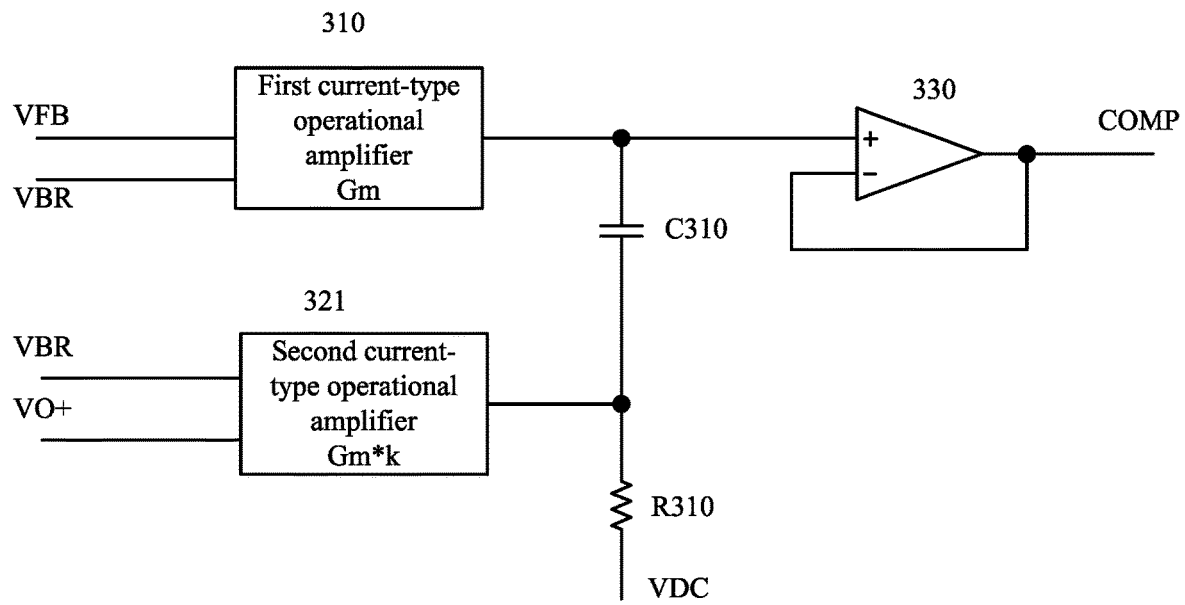
FIG. 5 is a schematic circuit diagram of another embodiment of the operational amplifier 300 according to the present disclosure.

FIG. 5 shows an embodiment with reference to a proportion amplification circuit 320. The proportion amplification circuit includes a second current-type operational amplifier 321 and a first resistor R310. The second current-type operational amplifier 321 receives the first voltage and the reference voltage VBR. An output of the second current-type operational amplifier 321 is coupled to the common-mode voltage VDC through the first resistor R310. The output of the second current-type operational amplifier 321 is an output of the proportion amplification circuit 320.

In an embodiment, a gain of the second current-type operational amplifier 321 is k times that of the first current-type operational amplifier 310. k may be greater than 1.

Figure 6:
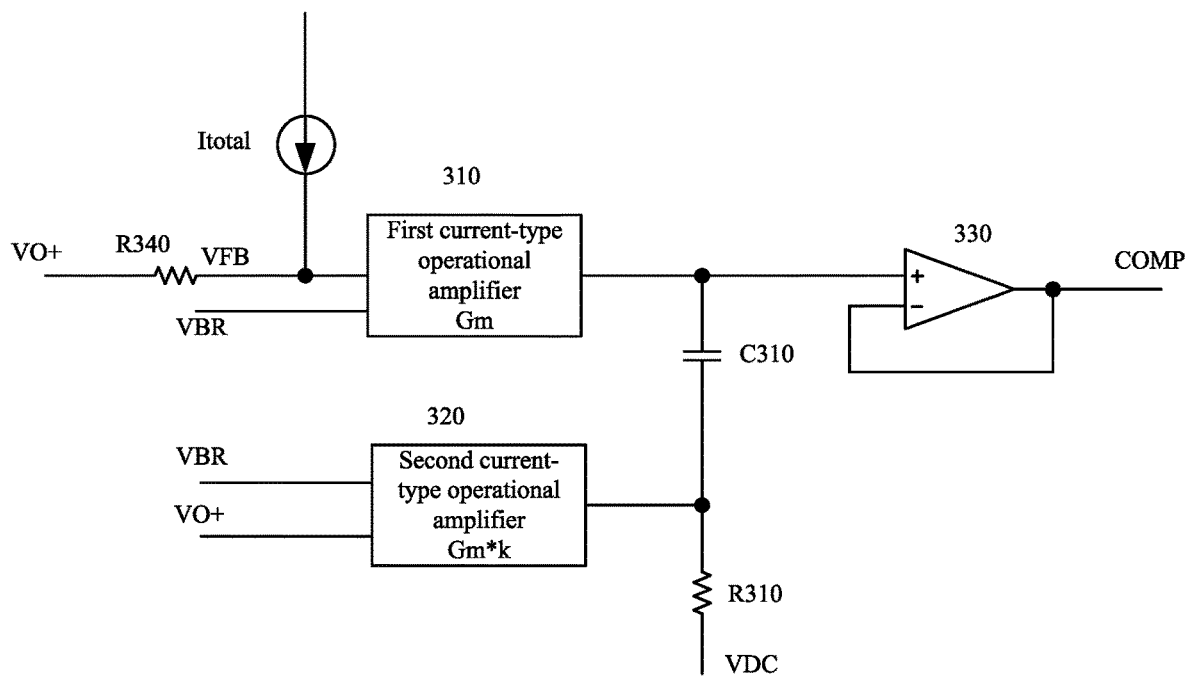
FIG. 6 is a schematic circuit diagram of an embodiment of the operational amplifier 300 according to the present disclosure added with DROOP.

As shown in FIG. 6, in an embodiment, a DROOP function is added, that is, when the output current is high, the voltage at the output terminal drops due to the voltage drop on the output wire, and the voltage sampled by the output voltage feedback does not contain the voltage drop on the wire. Therefore, the voltage drop on the wire also needs to be taken into account. The first voltage is an output voltage VO+. The first feedback voltage VFB is an output feedback voltage. The output voltage VO+ is coupled to the output feedback voltage through a second resistor R340. An output sampling current Itotal is coupled to the output feedback voltage. By sampling the output current and generating a voltage drop on the second resistor R340, the voltage drop on the output wire may be equivalent to.

Figure 7:
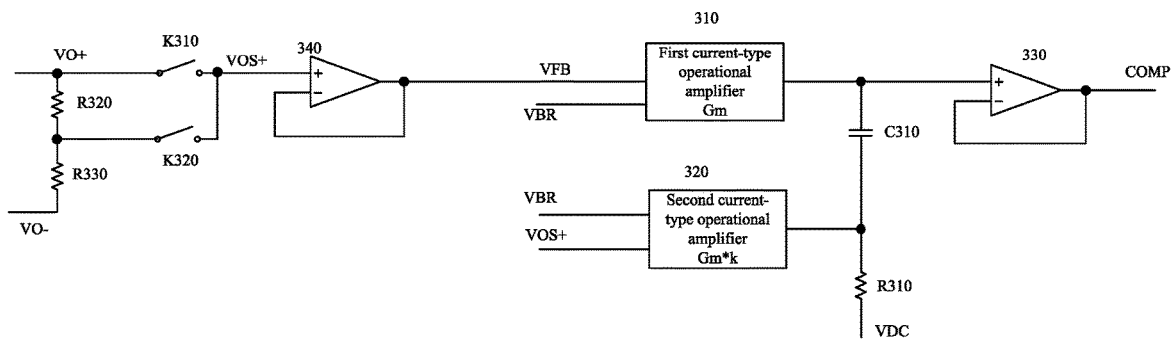
FIG. 7 is a schematic circuit diagram of an embodiment of the operational amplifier 300 according to the present disclosure added with a voltage-dividing circuit.

As shown in FIG. 7, in an embodiment, an output voltage divider function is added. The first voltage is coupled to the first feedback voltage through a voltage-dividing circuit. The voltage-dividing circuit divides the first voltage. The voltage-dividing circuit includes a first control switch K310, a second control switch K320, voltage-dividing resistors R320 and R330 and a second voltage follower 340. The first voltage is coupled to an input terminal of the second voltage follower 340 through the first control switch K310. The first voltage is coupled to the second control switch K320 through the voltage-dividing resistor R320. The second control switch K320 is coupled to the input terminal of the second voltage follower 340. An output terminal of the second voltage follower 340 is coupled to the first feedback voltage VFB. The operational amplification circuit receives the reference voltage VBR and an input terminal voltage VOS+ of the second voltage follower. When the first control switch K310 is on and the second control switch K320 is off, the first voltage is coupled to the first feedback voltage through the voltage follower, and the value of the first feedback voltage is equal to the first voltage. When the second control switch K320 is on and the first control switch K310 is off, the first voltage is divided by the resistor, then coupled to the first feedback voltage through the voltage follower, and the value of the first feedback voltage is equal to the voltage value after the first voltage is divided. In the switching circuit, the first voltage is an output voltage, the first feedback voltage is an output feedback voltage.

Figure 8:
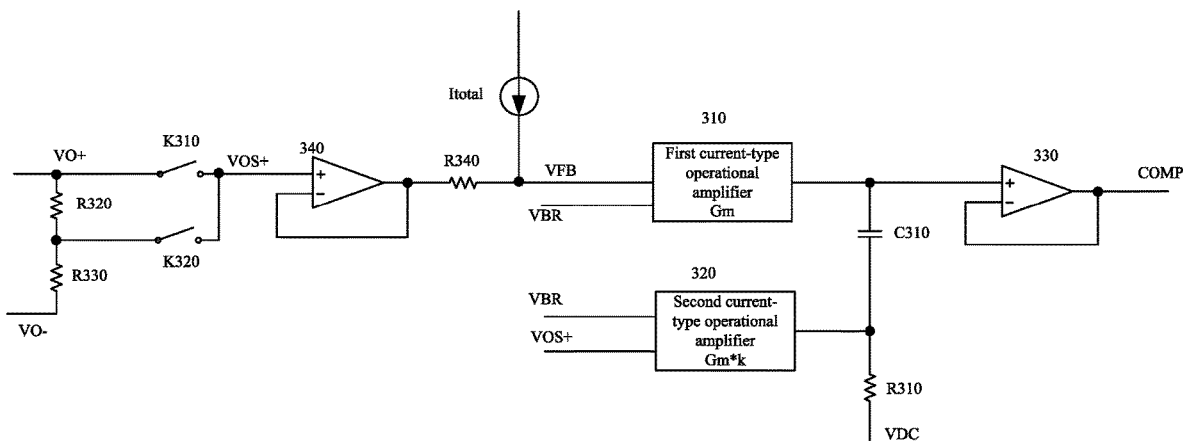
FIG. 8 is a schematic circuit diagram of an embodiment of the operational amplifier 300 according to the present disclosure added with both DROOP and the voltage-dividing circuit.

In an embodiment, both output voltage divider function and DROOP function may be added. As shown in FIG. 8, the output voltage is coupled to the feedback voltage VFB through a voltage-dividing circuit and then through a circuit with DROOP function composed of a resistor R340 and the output sampling current Itotal.

A yet another technical solution of the present disclosure is to provide a switching circuit.

Although the embodiments are separately illustrated and described above, the embodiments contain some common technologies. Those skilled in the art can replace and integrate the embodiments. Any content not clearly recorded in one of the embodiments may be determined based on another embodiment where the content is recorded.

The embodiments described above do not constitute a limitation on the scope of protection of the technical solution of the present disclosure. Any modification, equivalent replacement, and improvement made within the spirit and principle of the above-mentioned embodiments shall fall within the scope of protection of the technical solution of the present disclosure.

What is claimed is:

1. A control method of a switching circuit, comprising the following steps:
    generating a first voltage reference;
    controlling slopes of a rising edge and a falling edge to generate a second voltage reference; and
    performing an operational amplification on an output feedback voltage and a reference voltage to obtain a compensation voltage, wherein
        when the first voltage reference has the falling edge, the reference voltage is coupled to the first voltage reference through a first switch, and the second voltage reference is coupled to an output voltage through a second switch; and
        when the first voltage reference has the rising edge, the reference voltage is coupled to the second voltage reference through a third switch.

2. The control method according to claim 1, wherein the slopes of the rising edge and the falling edge of the first voltage reference are controlled according to set slopes to generate the second voltage reference.

3. The control method according to claim 2, wherein a central processing unit (CPU) is configured to set the slopes.

4. A control circuit of a switching circuit, comprising a slope buffer and a first operational amplifier, wherein
    the slope buffer is configured to receive a first voltage reference, and the slope buffer is configured to control slopes of a rising edge and a falling edge to generate a second voltage reference;
    the first operational amplifier is configured to receive an output feedback voltage and a reference voltage, and the first operational amplifier is configured to perform an operational amplification to obtain a compensation voltage; and
    when the first voltage reference has the falling edge, the reference voltage is coupled to the first voltage reference through a first switch, and the second voltage reference is coupled to an output voltage through a second switch; and when the first voltage reference has the rising edge, the reference voltage is coupled to the second voltage reference through a third switch.

5. The control circuit according to claim 4, wherein the slopes of the rising edge and the falling edge of the first voltage reference are controlled according to set slopes to generate the second voltage reference.

6. The control circuit according to claim 5, wherein a central processing unit CPU is configured to set the slopes.

7. The control circuit according to claim 4, further comprising a digital-to-analog conversion circuit, wherein the digital-to-analog conversion circuit generates the first voltage reference.

8. The control circuit according to claim 4, wherein when the first voltage reference has the falling edge, a first signal changes from being invalid to being valid; when the first voltage reference has the rising edge, the first signal changes from being valid to being invalid; when the first signal is valid, the reference voltage is coupled to the first voltage reference through the first switch, and the second voltage reference is coupled to the output voltage through the second switch; and when the first signal is invalid, the reference voltage is coupled to the second voltage reference through the third switch.

9. The control circuit according to claim 8, wherein when a first enable signal is valid, and when the first voltage reference has the falling edge, the first signal changes from being invalid to being valid; and when the first voltage reference has the rising edge, the first signal changes from being valid to being invalid; and when the first enable signal is invalid, the first signal is invalid.

10. The control circuit according to claim 4, wherein the slope buffer comprises a second operational amplifier and a first capacitor; and a first terminal of the second operational amplifier receives the first voltage reference, and a second terminal of the second operational amplifier is coupled to an output terminal of the second operational amplifier, and is coupled to a negative voltage output terminal of the switching circuit through the first capacitor.

11. The control circuit according to claim 4, wherein the first operational amplifier includes a first current-type operational amplifier, a first compensation capacitor, a proportion amplification circuit and a first voltage follower, wherein the first current-type operational amplifier is configured to receive the output feedback voltage and the reference voltage, the proportion amplification circuit is configured to receive the output voltage and the reference voltage, and is coupled to a common-mode voltage, an output of the first current-type operational amplifier is coupled to an output of the proportion amplification circuit through the first compensation capacitor, and the output of the first current-type operational amplifier is configured to generate the compensation voltage through the first voltage follower.

12. A switching circuit, comprising a control circuit, wherein the control circuit comprises a slope buffer and a first operational amplifier, wherein the slope buffer is configured to receive a first voltage reference, and the slope buffer is configured to control slopes of a rising edge and a falling edge to generate a second voltage reference;

the first operational amplifier is configured to receive an output feedback voltage and a reference voltage, and the first operational amplifier is configured to perform an operational amplification to obtain a compensation voltage; and when the first voltage reference has the falling edge, the reference voltage is coupled to the first voltage reference through a first switch, and the second voltage reference is coupled to an output voltage through a second switch; and when the first voltage reference has the rising edge, the reference voltage is coupled to the second voltage reference through a third switch.

13. The switching circuit according to claim 12, wherein the slopes of the rising edge and the falling edge of the first voltage reference are controlled according to set slopes to generate the second voltage reference.

14. The control circuit according to claim 13, wherein a CPU is configured to set the slopes.

15. The control circuit according to claim 12, wherein the control circuit further comprises a digital-to-analog conversion circuit, wherein the digital-to-analog conversion circuit generates the first voltage reference.

16. The control circuit according to claim 12, wherein when the first voltage reference has the falling edge, a first signal changes from being invalid to being valid; when the first voltage reference has the rising edge, the first signal changes from being valid to being invalid; when the first signal is valid, the reference voltage is coupled to the first voltage reference through the first switch, and the second voltage reference is coupled to the output voltage through the second switch; and when the first signal is invalid, the reference voltage is coupled to the second voltage reference through the third switch.

17. The control circuit according to claim 16, wherein when a first enable signal is valid, and when the first voltage reference has the falling edge, the first signal changes from being invalid to being valid; and when the first voltage reference has the rising edge, the first signal changes from being valid to being invalid; and when the first enable signal is invalid, the first signal is invalid.

18. The control circuit according to claim 12, wherein the slope buffer comprises a second operational amplifier and a first capacitor; and a first terminal of the second operational amplifier receives the first voltage reference, and a second terminal of the second operational amplifier is coupled to an output terminal of the second operational amplifier, and is coupled to a negative voltage output terminal of the switching circuit through the first capacitor.

19. The control circuit according to claim 12, wherein the first operational amplifier includes a first current-type operational amplifier, a first compensation capacitor, a proportion amplification circuit and a first voltage follower, wherein the first current-type operational amplifier is configured to receive the output feedback voltage and the reference voltage, the proportion amplification circuit is configured to receive the output voltage and the reference voltage, and is coupled to a common-mode voltage, an output of the first current-type operational amplifier is coupled to an output of the proportion amplification circuit through the first compensation capacitor, and the output of the first current-type operational amplifier is configured to generate the compensation voltage through the first voltage follower.

* * * * *